(12) United States Patent
Basu et al.

(10) Patent No.: US 9,666,684 B2
(45) Date of Patent: May 30, 2017

(54) III-V SEMICONDUCTOR DEVICE HAVING SELF-ALIGNED CONTACTS

(71) Applicant: GLOBALFOUNDRIES INC., Grand Cayman (KY)

(72) Inventors: Anirban Basu, Elmsford, NY (US); Amlan Majumdar, White Plains, NY (US); Yanning Sun, Scarsdale, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 104 days.

(21) Appl. No.: 13/945,281

(22) Filed: Jul. 18, 2013

(65) Prior Publication Data

US 2015/0021662 A1    Jan. 22, 2015

(51) Int. Cl.
| | | |
|---|---|---|
| *H01L 29/78* | (2006.01) | |
| *H01L 29/66* | (2006.01) | |
| *H01L 29/778* | (2006.01) | |
| *H01L 29/205* | (2006.01) | |
| *H01L 29/417* | (2006.01) | |
| *H01L 29/423* | (2006.01) | |

(52) U.S. Cl.
CPC .... *H01L 29/66462* (2013.01); *H01L 29/7784* (2013.01); *H01L 29/78* (2013.01); *H01L 29/205* (2013.01); *H01L 29/41775* (2013.01); *H01L 29/4236* (2013.01)

(58) Field of Classification Search
CPC ....................................................... H01L 29/78
USPC ....................................................... 438/300
See application file for complete search history.

(56) References Cited

U.S. PATENT DOCUMENTS

| | | |
|---|---|---|
| 7,648,871 B2 | 1/2010 | Belyansky et al. |
| 7,659,160 B2 | 2/2010 | Belyansky et al. |
| 7,955,917 B2 | 6/2011 | Hanafi |
| 7,964,896 B2 | 6/2011 | Kiewra et al. |
| 8,445,371 B2 | 5/2013 | Guo et al. |
| 8,455,932 B2 | 6/2013 | Khakifirooz et al. |
| 2005/0090066 A1* | 4/2005 | Zhu et al. ..................... 438/300 |
| 2005/0186742 A1* | 8/2005 | Oh et al. ....................... 438/283 |

(Continued)

OTHER PUBLICATIONS

Xingui Zhang et al., "III-V MOSFETs with a New Self-Aligned Contact", 2010 Symposium on VLSI Technology Digest of Technical Papers, pp. 233-234.

(Continued)

*Primary Examiner* — Kenneth Parker
*Assistant Examiner* — Christopher Culbert
(74) *Attorney, Agent, or Firm* — Scully Scott Murphy and Presser; Frank Digiglio

(57) ABSTRACT

A method including forming a III-V compound semiconductor-containing heterostructure, forming a gate dielectric having a dielectric constant greater than 4.0 positioned within a gate trench, the gate trench formed within the III-V compound semiconductor-containing heterostructure, and forming a gate conductor within the gate trench on top of the gate dielectric, the gate conductor extending above the III-V compound semiconductor heterostructure. The method further including forming a pair of sidewall spacers along opposite sides of a portion of the gate conductor extending above the III-V compound semiconductor-containing heterostructure and forming a pair of source-drain contacts self-aligned to the pair of sidewall spacers.

8 Claims, 12 Drawing Sheets

(56) References Cited

U.S. PATENT DOCUMENTS

| | | | |
|---|---|---|---|
| 2007/0096185 A1* | 5/2007 | Kim et al. | 257/301 |
| 2008/0237663 A1 | 10/2008 | Hanafi | |
| 2008/0308867 A1* | 12/2008 | Cai et al. | 257/348 |
| 2011/0147798 A1* | 6/2011 | Radosavljevic et al. | 257/194 |
| 2013/0001657 A1 | 1/2013 | Cheng et al. | |
| 2013/0001659 A1 | 1/2013 | Cheng et al. | |
| 2013/0032927 A1 | 2/2013 | Urteaga et al. | |
| 2013/0154016 A1* | 6/2013 | Glass et al. | 257/368 |

OTHER PUBLICATIONS

Yee-Chia Yeo et al., "Self-aligned Contact Metallization for III-V Channel Field-Effect Transistors", © 2012 IEEE.

K. Shinohara et al., "547-GHz ft In0.7 Ga0.3 As—In0.52Al0.48 As HEMTs With Reduced Source and Drain Resistance", IEEE Electron Device Letters, vol. 25, No. 5, May 2004, pp. 241-243.

Dae-Hyun Kim et al., "Logic Performance of 40 nm InAs HEMTs", © 2007 IEEE, pp. 629-632.

Dae-Hyun Kim et al., "30-nm InAs Pseudomorphic HEMTs on an InP Substrate With a Current-Gain Cutoff Frequency of 628 GHz", IEEE Electron Device Letters, vol. 29, No. 8, Aug. 2008, pp. 830-833.

M. Radosavljevic et al., "Advanced High-K Gate Dielectric for High-Performance Short-Channel In0.7Ga0.3As Quantum Well Field Effect Transistors on Silicon Substrate for Low Power Logic Applications", © 2009 IEEE, pp. 13.1.1-13.1.4.

M. Radosavljevic et al., "Non-Planar, Multi-Gate InGaAs Quantum Well Field Effect Transistors with High-K Gate Dielectric and Ultra-Scaled Gate-to-Drain/Gate-to-Source Separation for Low Power Logic Applications", © 2010 IEEE, pp. 6.1.1-6.1.4.

\* cited by examiner

III-V SEMICONDUCTOR DEVICE HAVING SELF-ALIGNED CONTACTS

BACKGROUND

The present invention generally relates to semiconductor structures, and more particularly to a III-V semiconductor field-effect transistor structure having a gate dielectric and self-aligned source-drain contacts.

Compound semiconductors are receiving renewed attention for use as channel materials for advanced ultra large scale integration (ULSI) digital logic applications due to their high electron mobility. For example, the InGaAs/InAlAs material system is one of the most promising material systems for this application due to its large conduction-band offsets and high electron mobility. Schottky-gated InGaAs high electron mobility transistors (HEMTs) grown on InP substrates have produced maximum transconductance $g_m$ values over 2 S/mm and have been shown to compare favorably in terms of a power-delay product.

SUMMARY

According to one embodiment of the present invention, a method is provided. The method may include forming a III-V compound semiconductor-containing heterostructure, forming a gate dielectric having a dielectric constant greater than 4.0 positioned within a gate trench, the gate trench formed within the III-V compound semiconductor-containing heterostructure, and forming a gate conductor within the gate trench on top of the gate dielectric, the gate conductor extending above the III-V compound semiconductor heterostructure. The method may further include forming a pair of sidewall spacers along opposite sides of a portion of the gate conductor extending above the III-V compound semiconductor-containing heterostructure and forming a pair of source-drain contacts self-aligned to the pair of sidewall spacers.

According to another embodiment of the present invention, a method is provided. The method may include forming a III-V compound semiconductor-containing heterostructure, forming a gate trench in a dielectric layer and the III-V compound semiconductor-containing heterostructure, the dielectric layer located above the III-V compound semiconductor-containing heterostructure, and the gate trench extending from a top surface of the dielectric layer down to a channel layer of III-V compound semiconductor-containing heterostructure, forming a gate dielectric within the gate trench, and forming a gate conductor within the gate trench on top of the gate dielectric, a portion of the gate conductor extending above the III-V compound semiconductor-containing heterostructure being wider than a portion of the gate conductor within the gate trench. The method may further include forming a pair of sidewall spacers along opposite sides of a portion of the gate conductor extending above the dielectric layer, removing a portion of the dielectric layer selective to the III-V compound semiconductor-containing heterostructure and selective to the pair of sidewall spacers, a remaining portion of the dielectric layer remains below each of the sidewall spacers and above the III-V compound heterostructure, and forming a pair of source-drain contacts within the III-V compound semiconductor-containing heterostructure and self-aligned to the pair of sidewall spacers, where an edge of each individual source-drain contact is aligned with an outside edge of each individual sidewall spacer.

According to another embodiment of the present invention, a structure is provided. The structure may include a III-V compound semiconductor-containing hetero structure, a gate conductor partially embedded in the III-V compound semiconductor-containing heterostructure, the gate conductor extending from above the III-V compound semiconductor-containing heterostructure down to a channel layer within the III-V compound semiconductor-containing heterostructure, and a gate dielectric position along the bottom and opposite sides of the gate conductor, the gate dielectric located between the gate conductor and the III-V compound semiconductor-containing heterostructure. The structure may further include a pair of sidewall spacers positioned on opposite sides of the gate conductor above a dielectric layer, the dielectric layer being above the III-V compound semiconductor-containing heterostructure and a pair of source-drain contacts located within the III-V compound semiconductor-containing heterostructure, and self-aligned to the pair of sidewall spacers.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
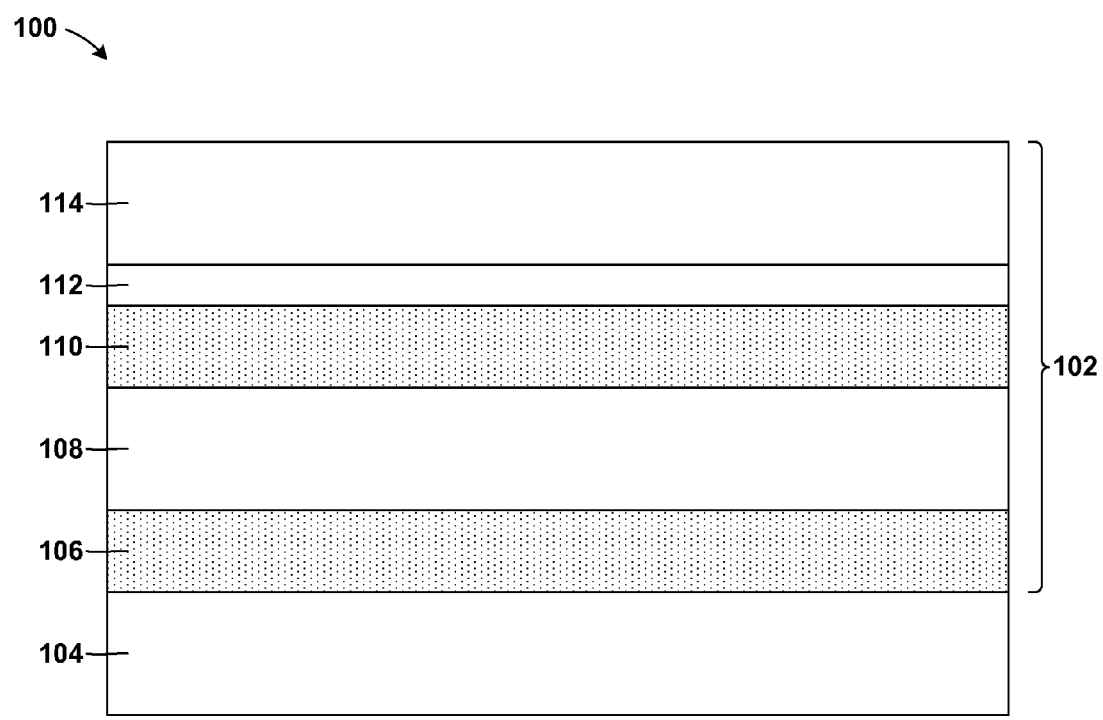
FIG. 1 is a cross-sectional view of a semiconductor heterostructure formed on top of a substrate according to an exemplary embodiment.

Detailed embodiments of the claimed structures and methods are disclosed herein; however, it is understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

In one embodiment, a semiconductors structure such as a III-V semiconductor field-effect transistor device (hereinafter "III-V device") with a gate dielectric and having self-aligned source-drain contacts can be fabricated. One embodiment by which to fabricate the III-V device with the gate dielectric and self-aligned source-drain contacts is described in detail below by referring to the accompanying drawings FIGS. 1-10. In the present embodiment, the self-aligned source-drain contacts of the III-V device may be self-aligned to a pair of sidewall spacers formed on opposite sides of a gate conductor.

Referring now to FIG. 1, a structure 100 including a III-V compound semiconductor-containing heterostructure 102 (hereinafter "heterostructure 102") formed on top of a substrate 104 is shown. The heterostructure 102 may include a III-V compound semiconductor buffer layer 106 (hereinafter "buffer layer 106"), a III-V compound semiconductor channel layer 108 (hereinafter "channel layer 108"), and a III-V compound semiconductor barrier layer 110 (hereinafter "barrier layer 110"). The buffer layer 106 may be above the substrate 104 and have a first bandgap. The channel layer 108 may be above the buffer layer 106 and have a second bandgap. The barrier layer 110 may be above the channel layer 108 and have a third bandgap.

In the present embodiment, the term "III-V compound semiconductor" may denote a semiconductor material that includes at least one element from Group III of the Periodic Table of Elements and at least one element from Group V of the Periodic Table of Elements. Typically, each of the III-V compound semiconductor layers is a binary, ternary or quaternary III-V containing compound. Examples of III-V compound semiconductors that can be used in the present invention include, but are not limited to alloys of InGaAs, InAlAs, InAlAsSb, InAlAsP and InGaAsP.

In the present embodiment, the barrier layer 110 may include a delta doped region (not shown) that is located in a lower region of barrier layer 110 adjacent to, but not in direct contact with, the interface between the barrier layer 110 and the underlying channel layer 108. The delta doped region may include an n-type dopant (for example, an element from Group IV or VI of the Periodic Table of Elements) or a p-type dopant (for example, an element from Group II or IV of the Periodic Table of Elements). The dopant concentration within the delta doped region may typically range from about $10^{11}$ to about $10^{15}$ atoms/cm$^2$, with a dopant concentration within the delta doped region ranging from about $10^{11}$ to about $10^{13}$ atoms/cm$^2$ being even more typical.

The semiconductor substrate 104 illustrated in the present embodiment may include any semiconductor material including, for example, Si, SiGe, SiGeC, SiC, Ge alloys, Ga, GaAs, InAs, InP, Ge and all other III-V compound semiconductors. The semiconductor substrate 104 may include a layered semiconductor material such as, for example, a semiconductor-on-insulator. The semiconductor substrate 104 may be doped, undoped or contain doped and undoped regions therein. The semiconductor substrate 104 may have a single crystal orientation or it may have surface regions that have different crystal orientations. The semiconductor substrate 104 may be strained, unstrained or a combination thereof.

In accordance with the present embodiment, the bandgap of the barrier layer 110 (for example, the third bandgap) may be larger (wider) than the bandgap of the channel layer 108 (for example, the second bandgap). As stated above, the term "bandgap" refers to the energy difference between the top of the valence band (i.e., $E_V$) and the bottom of the conduction band (i.e., $E_C$). Typically, the barrier layer 110 may include a III-V compound semiconductor having a bandgap value ranging from about 0.5 to about 10 times larger than the bandgap of the III-V compound semiconductor material used in the channel layer 108. More typically, the barrier layer 110 may include a III-V compound semiconductor having a bandgap value ranging from about 1 to about 5 times larger than the bandgap of the III-V compound semiconductor material used in the channel layer 108.

The bandgap of the buffer layer 106 (for example, the first bandgap) may also be larger than that of the channel layer 108; this may help to confine the electrons within the channel layer 108 as well. Typically, the buffer layer 106 may include a III-V compound semiconductor having a bandgap value ranging from about 0.5 to about 10 times larger than the bandgap of the III-V compound semiconductor material used in the channel layer 108. More typically, the buffer layer 106 may include a III-V compound semiconductor having a bandgap value ranging from about 1 to about 5 times larger than the bandgap of the III-V compound semiconductor material used in the channel layer 108.

It should be noted that the bandgap of the buffer layer 106 and the bandgap of the barrier layer 110, which may be larger than the bandgap of the channel layer 108, may not necessarily have the same value.

Since wide bandgap materials may be used for the buffer layer 106 and the barrier layer 110, and a narrow bandgap material may be used for the channel layer 108, carriers may be confined to the channel layer 108 under certain gate bias ranges. Typically, the carriers may be confined in the channel layer 108 when typical gate bias conditions are applied.

In one embodiment, the buffer layer 106 and the barrier layer 110 may include an alloy of InAlAs, while the channel layer 108 may include an alloy of InGaAs. By "alloy of InAlAs" it is meant a composition of $In_xAl_{1-x}As$ wherein x is from about 0 to about 1, and more preferably from about 0.4 to about 0.6. In another embodiment, x is 0.52. By "alloy of InGaAs" it is meant a composition of $In_yGa_{1-y}As$ wherein y is from about 0 to about 1, and more preferably y may range from about 0.3 to about 0.8. In another embodiment, y is 0.7.

It should be noted that each of the III-V compound semiconductor layers used in the present embodiment may include a single crystal material of typical commercial quality. By "typical commercial quality" it is meant that each of the III-V compound semiconductor layers may have a defect density on the order of about $10^5$ atoms/cm$^2$ or less, with a defect density of less than about 5000 atoms/cm$^2$ being more typical. The typical commercial quality of the III-V compound semiconductor layers is a result of utilizing an epitaxial growth process such as, for example, molecular beam epitaxy (MBE) or metal-organic chemical vapor deposition (MOCVD). That is, each of the III-V compound semiconductor layers may be formed by an epitaxial growth process that produces a high quality, single crystal III-V film. The deposition of each of the III-V compound semiconductor layers of the preset embodiment may be performed in the same or different apparatus. Moreover, each of the III-V compound semiconductor layers can be formed without breaking vacuum during the deposition of each of the layers. Alternatively, vacuum may be broken during the formation of an individual III-V compound semiconductor layer.

The III-V compound semiconductors may be epitaxially grown utilizing III/V-containing precursors that are well known to those skilled in the art. When the vacuum between the deposition of each of the III-V layers is not broken, the precursors can be switched to provide the next layer. In some embodiments, a graded III-V compound semiconductor layer can be formed.

When the delta doped region is formed into the lower region of the barrier layer 110, an in-situ doping deposition process can be used in which the dopant atom is introduced during the initial formation of the barrier layer and following the formation of a desired thickness of the delta doped region (typically on the order of about 0.1 to about 2.0 nm), the dopant is removed from the precursor stream and the barrier layer 110 formation continues. Alternatively, the delta doped region can be formed using ion implantation after the barrier layer 110 has been formed. The conditions of such an implant may be selected to provide a delta doped region adjacent to, but not in contact with, the interface between the barrier layer 110 and the underlying channel layer 108.

Each of the individual III-V compound semiconductor layers shown in FIG. 1 are relatively thin (providing a total thickness of less than 600 nm). Typically, the buffer layer 106 may have a thickness ranging from about 25 nm to about 500 nm, with a thickness ranging from about 100 nm to about 300 nm being even more typical. The channel layer 108 may have a thickness ranging from about 1 nm to about 15 nm, with a thickness ranging from about 5 nm to about 10 nm being even more typical. The thickness of the barrier layer 110 may range from about 0.1 nm to about 10 nm, with a thickness from about 0.5 nm to about 10 nm being even more typical.

With continued reference to FIG. 1, the hetero structure 102 may further include a III-V compound semiconductor contact layer 114 (hereinafter "contact layer 114") above the barrier layer 110. It should be noted that the contact layer 114 may be optional. The contact layer 114 may be, but not always necessarily, a doped layer. The dopant within the contact layer 114 can be an n-type dopant or a p-type dopant, with an n-type dopant being more typical for an n-channel MOSFET. Unlike the delta doped region of the barrier layer 110 described above, the doping within the contact layer 114 may be evenly distributed throughout the entire vertical thickness of the layer. The dopant concentration within the contact layer 114 may typically range from about $10^{17}$ to about $10^{21}$ atoms/cm$^2$, with a dopant concentration within the contact layer 114 ranging from about $10^{18}$ to about $10^{20}$ atoms/cm$^2$ being more typical.

The contact layer 114 may include the same or different III-V compound semiconductor as the channel layer 108. In one embodiment, the contact layer 114 may include the same III-V compound semiconductor elements, but a different alloy composition, as the channel layer 108 except for the presence of dopants within the contact layer 114.

The contact layer 114 may also include a single crystal material of typical commercial quality since the contact layer 114 may be formed using an epitaxial growth process such as MBE or MOCVD. The doping of the contact layer 114 may typically occur during the deposition of the contact layer 114. Alternatively, the dopants can be introduced into the contact layer 114 post deposition by ion implantation or outdiffusion from a doped layer that is formed atop the contact layer 114. The thickness of the contact layer 114 may range from about 5 nm to about 50 nm, with a thickness ranging from about 15 nm to about 30 nm being even more typical.

In one embodiment, the buffer layer 106 and the barrier layer 110 may include an alloy of InAlAs, while the channel layer 110 and the contact layer 114 may include an alloy of InGaAs. The contact layer 114 may be heavily doped with an n-type dopant. By "alloy of InAlAs" it is meant a composition of $In_xAl_{1-x}As$ wherein x ranges from about 0 to about 1, and more preferably ranging from about 0.4 to about 0.6. In another embodiment, x is 0.52. By "alloy of InGaAs" it is meant a composition of $In_yGa_{1-y}As$ wherein y ranges from about 0 to about 1, and more preferably y ranges from about 0.3 to about 0.8. In one embodiment, y is 0.7.

In yet another embodiment, an etch stop layer 112 may be included in the heterostructure 102. The etch stop layer 112 may be positioned between the barrier layer 110 and the contact layer 114. Since the barrier layer 110 and the contact layer 114 may in some embodiments include the same or substantially similar materials, the etch stop layer 112 may be used to distinguish between the barrier layer 110 and the contact layer 114 during subsequent etching techniques. The etch stop layer 112 may include any suitable etch stop material known in the art. A suitable etch stop material may include any material that which has a different etch rate than the materials of either the barrier layer 110 or the contact layer 114.

Figure 2:
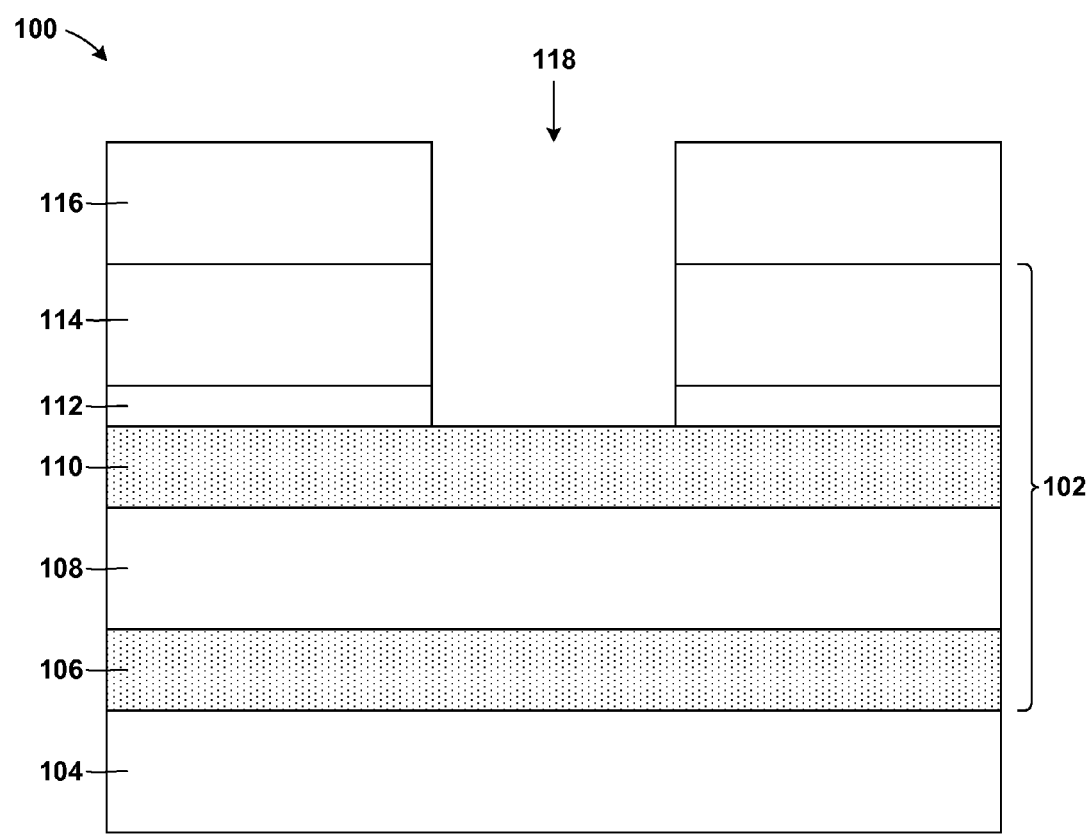
FIG. 2 is a cross-sectional view that illustrates forming a gate trench in the semiconductor heterostructure according to an exemplary embodiment.

Referring now to FIG. 2, a first dielectric layer 116 may be formed above the heterostructure 102, on top of the contact layer 114. The first dielectric layer 116 may include any suitable dielectric or insulator material known in the art deposited using known techniques. In one embodiment, the first dielectric layer 116 may include, for example, an oxide or a nitride. The first dielectric 116 may also be referred to as an inter-level dielectric. The thickness of the first dielectric layer 116 may range from about 10 nm to about 50 nm, with a thickness ranging from about 15 nm to about 30 nm being even more typical.

Next, a gate trench 118 may be patterned in the structure 100 using optical lithography techniques known in the art. More specifically, the gate trench 118 may be formed by removing a portion of each of the first dielectric layer 116, the contact layer 114, and the etch stop layer 112, as shown. In one embodiment, a reactive ion etching technique may be used to form the gate trench 118. Etching chemistries may be switched in order to remove portions of each of the layers listed above. In the present embodiment, the final chemistry chosen will preferably etch or remove a portion of the etch stop layer 112 selective to the barrier layer 110. The depth of the gate trench 118 may vary, as described in alternative embodiments discussed below with reference to FIGS. 11, 12, and 13.

Figure 3:
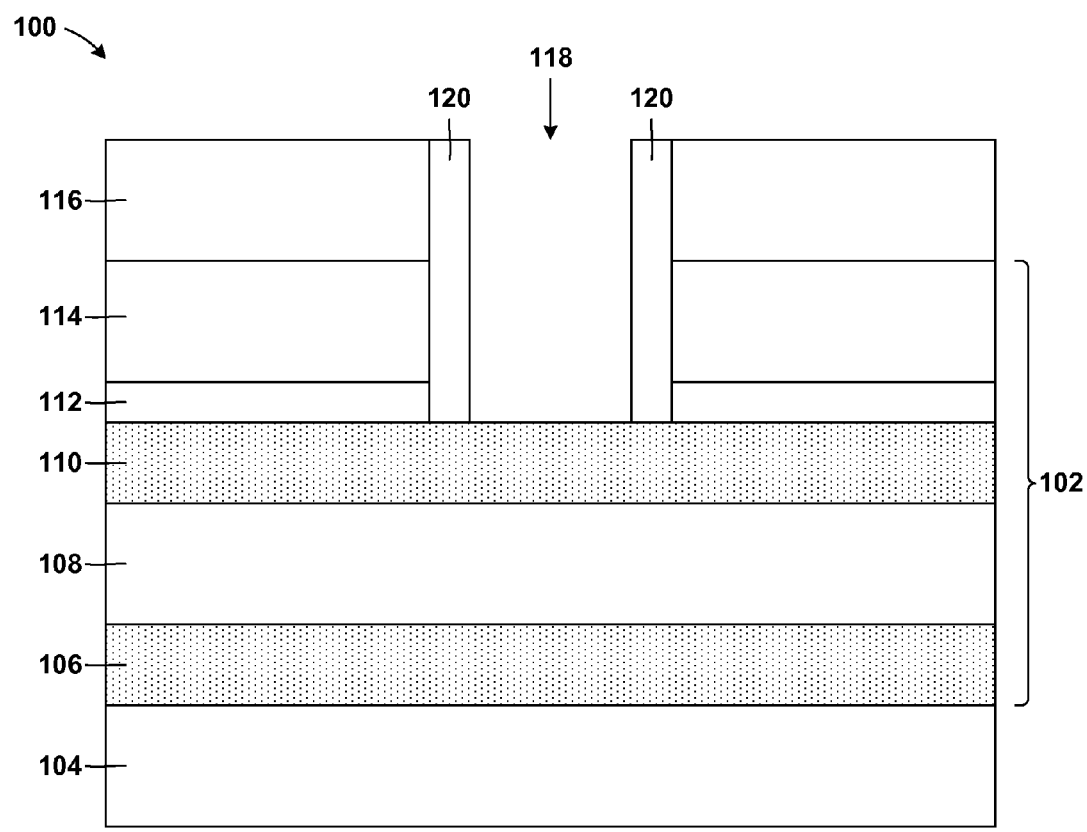
FIG. 3 is a cross-sectional view that illustrates forming inner spacers within the gate trench according to an exemplary embodiment.

Referring now to FIG. 3, a pair of inner spacers 120 (hereinafter "inner spacers 120") may be formed along opposite vertical sidewalls of the gate trench 118, as illustrated. The inner spacers 120 may be formed by conformally depositing or growing a dielectric, followed by an anisotropic etch that removes the dielectric from the horizontal surfaces of the structure 100, for example a top surface of the first dielectric layer 116 and a top surface of the barrier layer 110, while leaving it on the sidewalls of the gate trench 118. In one embodiment, the inner spacers 120 may include any suitable dielectric material, such as, for example, a nitride or an oxide. In one embodiment, the inner spacers 120 may include silicon nitride. In one embodiment, the inner spacers 120 may have a horizontal width, or thickness, ranging from about 5 nm to about 30 nm.

The inner spacers 120 may include a single layer; however, the inner spacers 120 may include multiple layers of dielectric material. The inner spacers 120 may be positioned along the vertical sidewalls of the gate trench 118 and separate the first dielectric layer 116, the contact layer 114 from a subsequently formed gate conductor. Here, it should also be noted that the inner spacers 120 depicted in FIG. 3 are for illustration purposes and generally can have a slightly different shape from those shown. For example, the inner spacers 120 can have rounded corners that can be naturally formed during the directional etching process as is known in the art.

Figure 4:
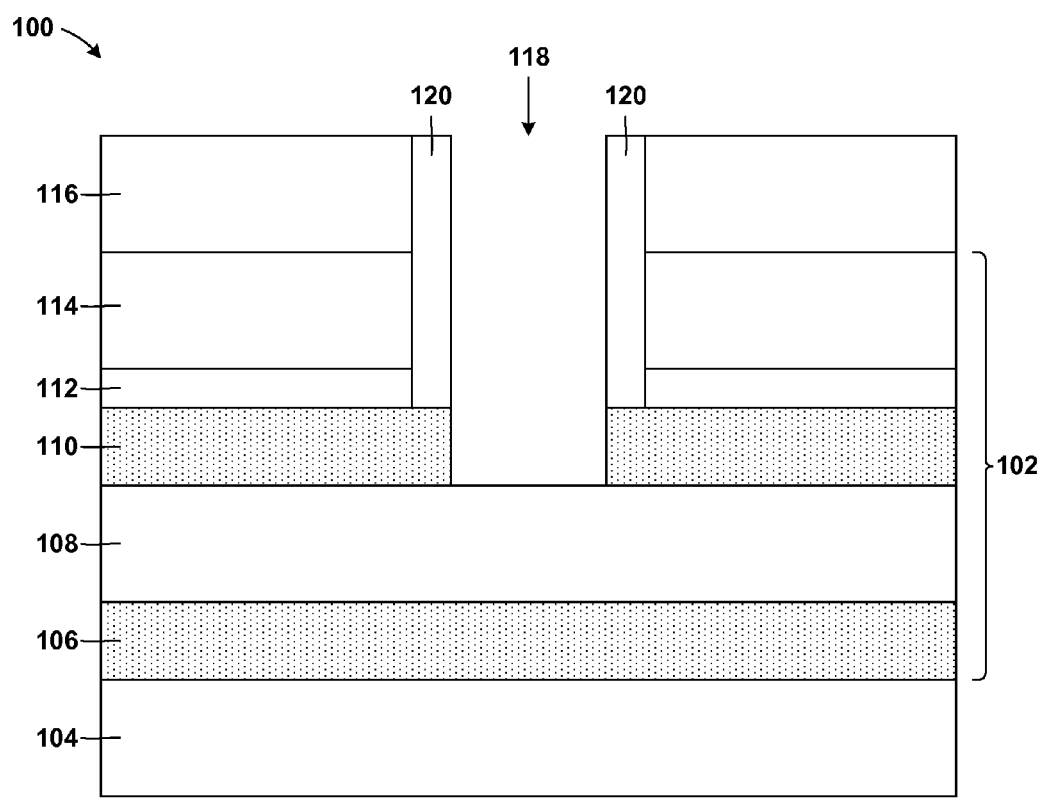
FIG. 4 is a cross-sectional view that illustrates the removal of a portion of a barrier layer at the bottom of the gate trench according to an exemplary embodiment.

Referring now to FIG. 4, a portion of the barrier layer 110 may optionally be removed from a bottom of the gate trench 118, as illustrated. The portion of the barrier layer 110 may be removed using any suitable etching technique known in the art. A suitable etching technique may include any anisotropic etching technique, such as, for example, reactive ion etching. The chosen etching technique and corresponding etch chemistry may preferably etch the barrier layer 110 selective to the channel layer 108, as illustrated. In some embodiments, the present step may be omitted. See FIGS. 11, 12 and 13.

Figure 5:
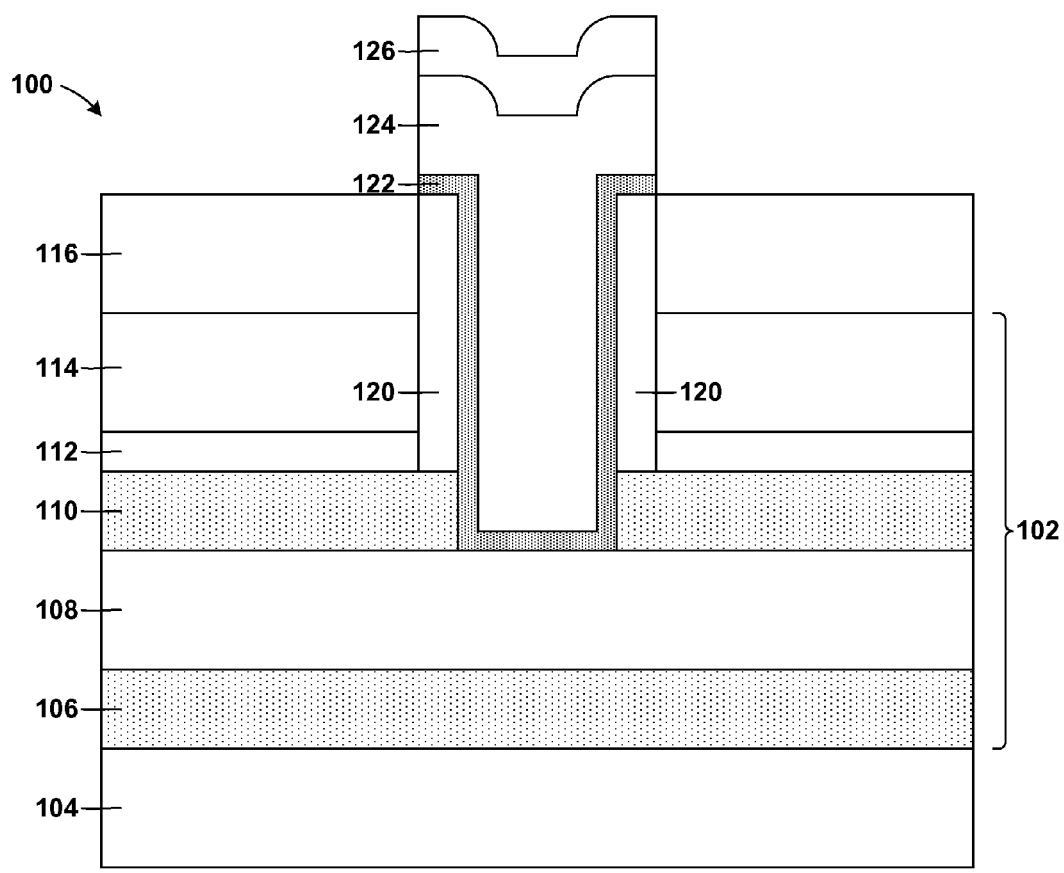
FIG. 5 is a cross-sectional view that illustrates the formation of a dielectric, a gate metal, and a gate cap according to an exemplary embodiment.

Referring now to FIG. 5, a gate dielectric 122 and a metal gate 124 may be formed within the gate trench 118 (FIG. 4), followed by the formation of a gate cap 126, as illustrated. First the gate dielectric 122 may be conformally deposited on the structure 100, including within the gate trench 118 (FIG. 4). The gate dielectric 122 of the present embodiment may have a dielectric constant greater than 4.0; such a dielectric material may be referred to as a high-k dielectric. Typically, the gate dielectric 122 may have a dielectric constant of about 7.0 or greater, with a dielectric constant of about 10.0 or greater being even more typical. The dielectric constants mentioned herein are relative to a vacuum, unless otherwise stated. Specifically, the gate dielectric 122 or the present embodiment may include, but not limited to, an oxide, nitride, oxynitride or silicates including metal silicates, aluminates, titanates and nitrides. In one embodiment, the gate dielectric 122 may include $HfO_2$, $ZrO_2$, $Al_2O_3$, $TiO_2$, $La_2O_3$, $SrTiO_3$, $LaAlO_3$, $Y_2O_3$, a pervoskite oxide, $HfSiO_x$, $HfAlO_x$ or $HfAlO_aN_b$. In one embodiment, the gate dielectric 122 may be a Hf-based dielectric material.

The gate dielectric 122 may be formed using any known conventional deposition process including, but not limited to molecular beam epitaxy (MBE), chemical vapor deposition (CVD), plasma enhanced chemical vapor deposition (PECVD), atomic layer deposition (ALD), evaporation, physical vapor deposition (PVD), chemical solution deposition and other like deposition processes.

The thickness of the gate dielectric 122 may vary depending on the deposition technique used as well as the composition and number of layers of the gate dielectric 122. Typically, the gate dielectric 122 may have a thickness ranging from about 0.5 nm to about 20 nm, with a thickness ranging from about 1 nm to about 10 nm being preferred, and a thickness ranging from about 1 nm to about 5 nm being most preferred.

The gate conductor 124 of the present invention may include any conductive material such as, for example, polysilicon, polysilicon germanium, conductive metals, conductive metal alloys, conductive silicides, conductive nitrides and combinations or multi-layers thereof. When metallic-containing gate conductors are used, the metallic gate conductor can be doped so as to shift the workfunction of the gate conductor. Illustrative examples of dopant ions include arsenic (As), phosphorous (P), boron (B), antimony (Sb), bismuth (Bi), aluminum (Al), gallium (Ga), titanium (Ti) or mixtures thereof. The same dopants may also be used with polysilicon or polysilicon-germanium mentioned above. Preferably, the gate conductor 124 may be a conductive metal, with aluminum (Al), platinum (Pt), gold (Au), tungsten (W) and titanium (Ti) being highly preferred. The selection of a metal gate conductor is advantageous since conductive metals have different workfunctions that permit one to adjust the threshold voltage of the device. The gate conductor 124 may be formed by a conventional deposition process such as, for example, chemical vapor deposition (CVD), plasma enhanced chemical vapor deposition (PECVD), physical vapor deposition (PVD), plating, thermal or ebeam evaporation and sputtering. In some embodiments, the gate conductor 124 may include a single layer or multiple layers of any of the conductive materials described above.

The gate cap 126 may be any oxide, nitride, oxynitride or any combination thereof. The gate cap 126 can be made of a similar or different dielectric material than the inner spacers 120. In one embodiment, the gate cap 126 may be a nitride such as, for example, $Si_3N_4$. In one embodiment, the gate cap 126 may be an oxide, such as, for example, $SiO_2$. Preferably, the gate cap 126 may have a vertical thickness ranging from about 20 nm to about 180 nm. More preferably the gate cap 126 may have a thickness ranging from about 30 nm to about 140 nm. In one embodiment, where the gate conductor 124 may be made from a silicon-containing material, a gate cap 126 may not be required to form a silicide contact on the gate conductor. However, in one embodiment, where the gate conductor 124 may be made from a material which does not contain silicon, a gate cap 126 may be required to form a silicide contact on the gate conductor 124.

The gate dielectric 122, the gate conductor 124, and the gate cap 126 may then be patterned by lithography and etching. In one embodiment, a reactive ion etching technique may be use to pattern the gate dielectric 122, the gate conductor 124, and the gate cap 126, as shown in FIG. 5. Alternatively, the gate dielectric 122, the gate conductor 124, and the gate cap 126 can be formed using a typical lift-off process. Each of the gate dielectric 122, the gate conductor 124, and the gate cap 126 may be etched in three different steps or stages using different etch chemistries. It should be noted that the gate conductor 124, described above, may alternatively be referred to as a T-gate because a portion of the gate conductor 124 extends outside the gate trench 118 (FIG. 2) on top of the gate dielectric 122. It should be further noted that due to lithography overlay error the resulting gate structure may not be aligned with the inner spacers 120, as illustrated.

Figure 6:
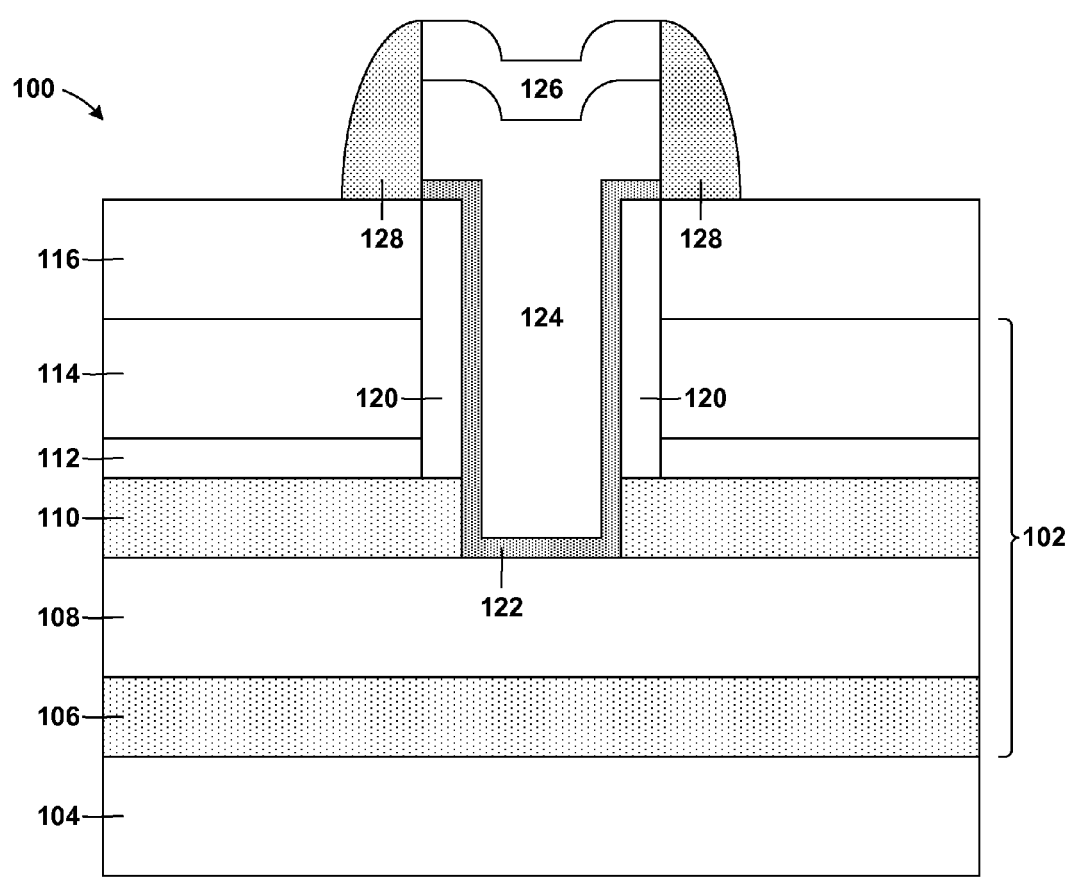
FIG. 6 is a cross-sectional view that illustrates the formation of the sidewall spacers according to an exemplary embodiment.

Referring now to FIG. 6, a pair of sidewall spacers 128 (hereinafter "sidewall spacers 128") may be formed along opposite vertical sidewalls of the gate dielectric 122, the gate conductor 124, and the gate cap 126, as illustrated. The sidewall spacers 128 may be formed by conformally depositing or growing a dielectric, followed by an anisotropic etch that removes the dielectric from the horizontal surfaces of the structure 100, for example a top surface of the gate cap 126 and a top surface of the first dielectric layer 116, while leaving it on the sidewalls of gate dielectric 122, the gate conductor 124, and the gate cap 126. In one embodiment, the sidewall spacers 128 may include any suitable dielectric material, such as, for example, a nitride or an oxide. In one embodiment, the sidewall spacers 128 may include silicon nitride. In one embodiment, the sidewall spacers 128 may have a horizontal width, or thickness, ranging from about 5 nm to about 10 nm.

The sidewall spacers 128 may include a single layer; however, the sidewall spacers 128 may include multiple layers of dielectric material. The sidewall spacers 128 may be positioned along the vertical sidewalls of the gate dielectric 122, the gate conductor 124, and the gate cap 126 to electrically insulate and physically separate the gate conductor 124 from subsequently formed structures.

Figure 7:
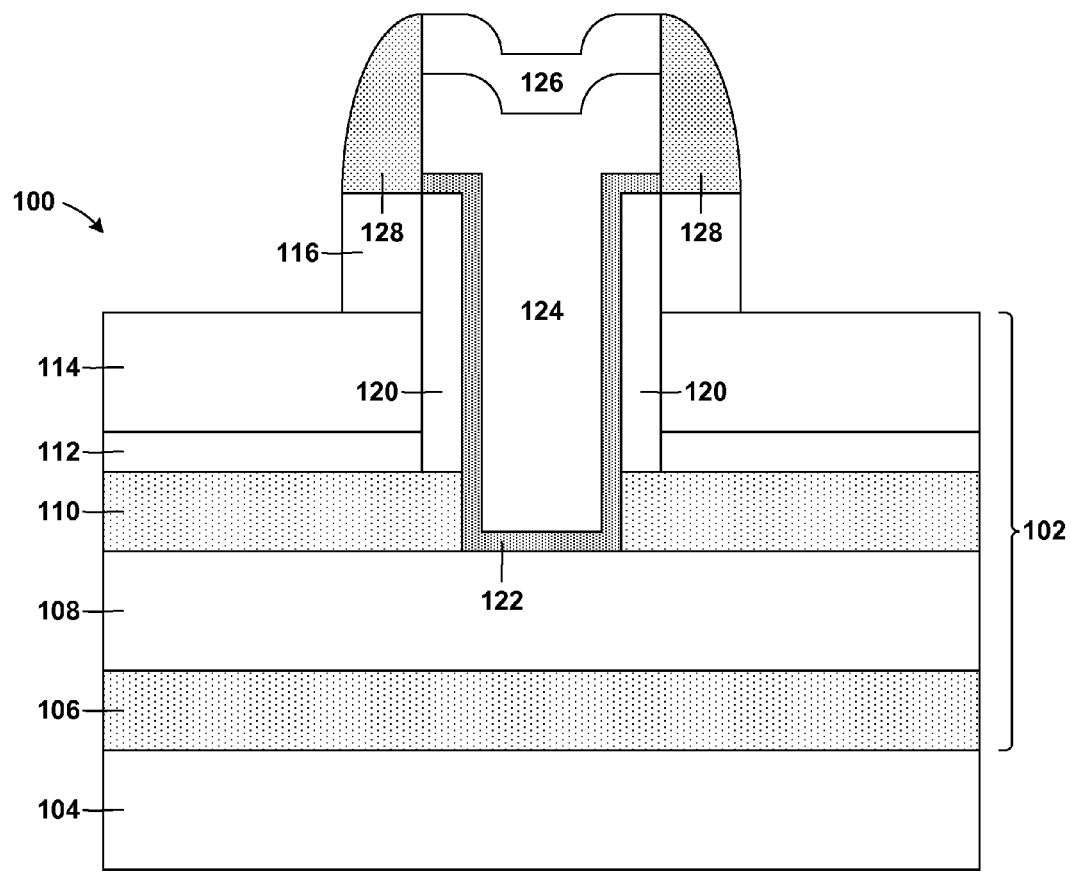
FIG. 7 is a cross-sectional view that illustrates the removal of a portion of a first dielectric layer according to an exemplary embodiment.

Referring now to FIG. 7, a portion of the first dielectric layer 116 may be removed selective to the contact layer 114, as illustrated. The portion of the first dielectric layer 116 may be removed using any suitable etching technique known in the art. A suitable etching technique may include any anisotropic etching technique, such as, for example, reactive ion etching. The chosen etching technique and corresponding etch chemistry may preferably etch the first dielectric layer 116 selective to the gate cap 126, the sidewall spacers 128, and stop on the contact layer 114, as illustrated. Therefore, the first dielectric layer 116 and the sidewall spacers 128 may each include different dielectric materials to produce the desired etch selectivity when removing a portion of the first dielectric layer 116.

Figure 8:
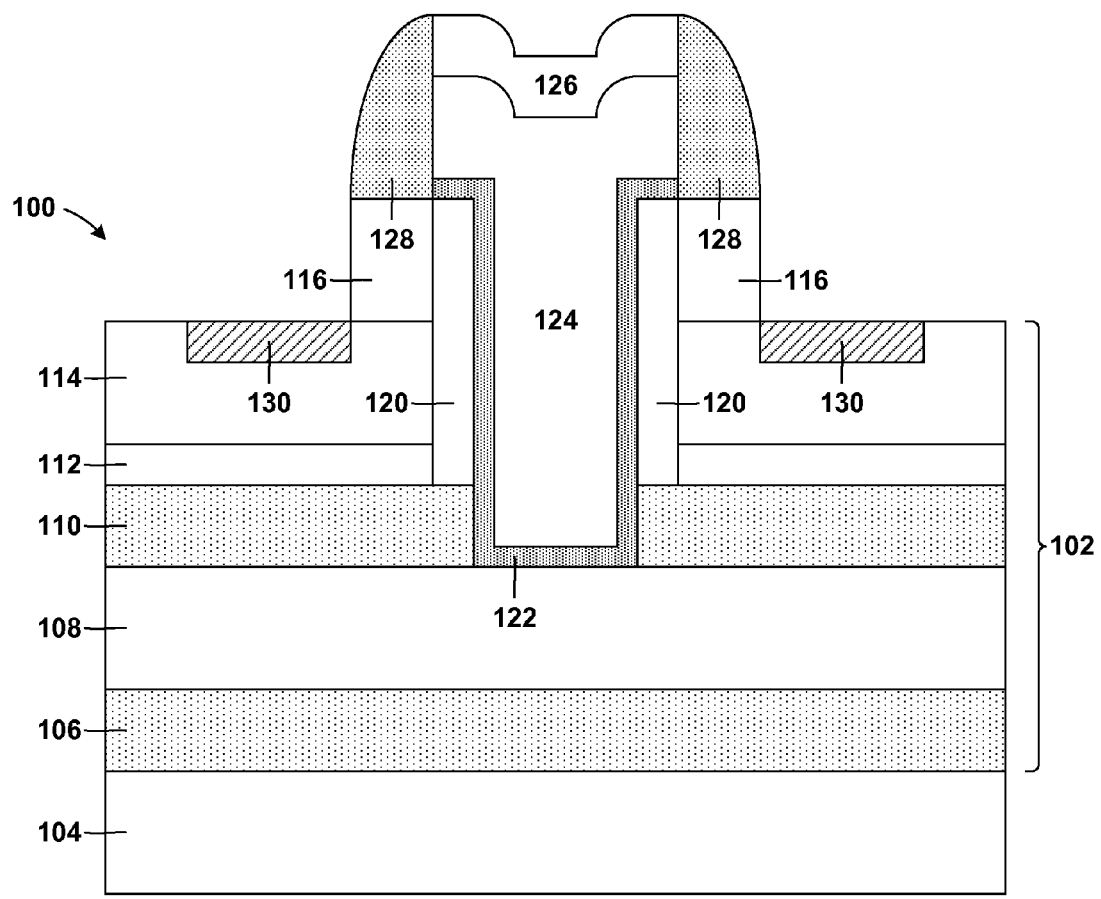
FIG. 8 is a cross-sectional view that illustrates the formation of self-aligned source-drain contacts according to an exemplary embodiment.

Referring now to FIG. 8, a pair of source-drain contacts 130 may be formed in the contact layer 114 using any suitable technique known in the art. Suitable techniques may include, contact metallization or epitaxial growth. In some cases, the source-drain contacts 130 may be recessed within the contact layer 114, as shown, or raised above the contact layer 114. In one embodiment, the source-drain contacts 130 may be formed, for example, by depositing a blanket metal layer (not shown) above the structure 100. A rapid thermal annealing technique may be applied to cause the metal from the blanket metal layer to react the dopants in the contact layer 114. Un-reacted metal from the blanket metal layer may then be selectively removed using, for example, a wet etching technique.

In an alternative embodiment, the source-drain contacts may be formed by lithographically etching a trench into the contact layer 114 and filling the trench with a conductive material. In such cases, the conductive material may be epitaxially grown within the trench to form the source-drain contacts.

In the present embodiment, the source-drain contacts 130 are self-aligned to the sidewall spacers 128 and the remaining portion of the first dielectric layer 116, as illustrated in the figure. Self-aligned contacts (for example the source-drain contacts 130) allow for a tight device pitch, while reducing the alignment error inherent in current lithography techniques. It should be noted that the source-drain contacts 130 may alternatively be referred to as Ohmic contacts.

Figure 9:
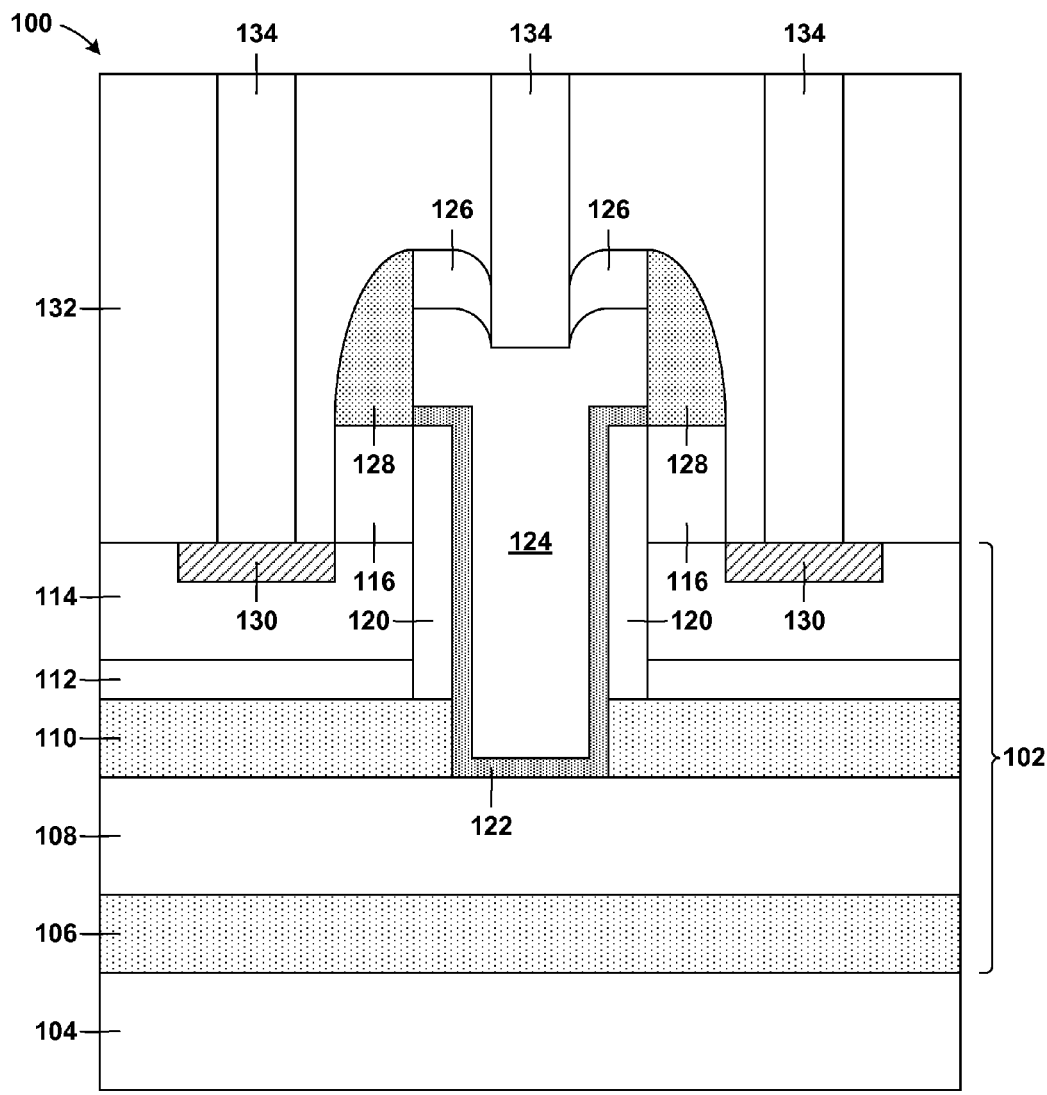
FIG. 9 is a cross-sectional view that illustrates the final structure after the formation of a second dielectric layer and contact vias according to an exemplary embodiment.

Referring now to FIG. 9, an inter-level dielectric 132 may be deposited above the structure 100, in which one or more contact vias 134 may be formed therein. The inter-level dielectric 132 and the contact vias may be formed according to known techniques. The final structure 100 of FIG. 9 is further illustrated with a "T-gate", as described above. The "T-gate" may result in reduced gate resistance because of larger gate cross section, thereby improving alternate current (ac) high-speed device performance.

It should be noted, however, that the source-drain contacts 130 of the present embodiment may be referred to as "semi-self-aligned" due to the fact that they are positioned adjacent to and self-aligned to the first dielectric layer 116. The structure 100 illustrated in the figure may be fabricated with a thicker contact layer 114, and omitting the first dielectric layer 116; however, doing so may be detrimental to the function and operation of the III-V device. A thicker contact layer 114 may increase the resistance between the contact layer 114 and the channel layer, thereby negatively affecting device performance. A thicker contact layer 114 may also increase overlap capacitance between the contact and the gate, thereby negatively affecting ac high-speed device performance.

Further, the structure 100 illustrated in the figures may be fabricated with a shorter gate, and also omitting the first dielectric layer 116 however doing so will also detrimentally affect the function and operation of the III-V device. A shorter gate may increase gate resistance, thereby degrading alternate current (ac) high-speed device performance.

FIG. 9 illustrates the final structure 100 including a III-V semiconductor device having a T-gate structure, the gate dielectric 122 and self-aligned source-drain contacts 130, as described above.

Figure 10:
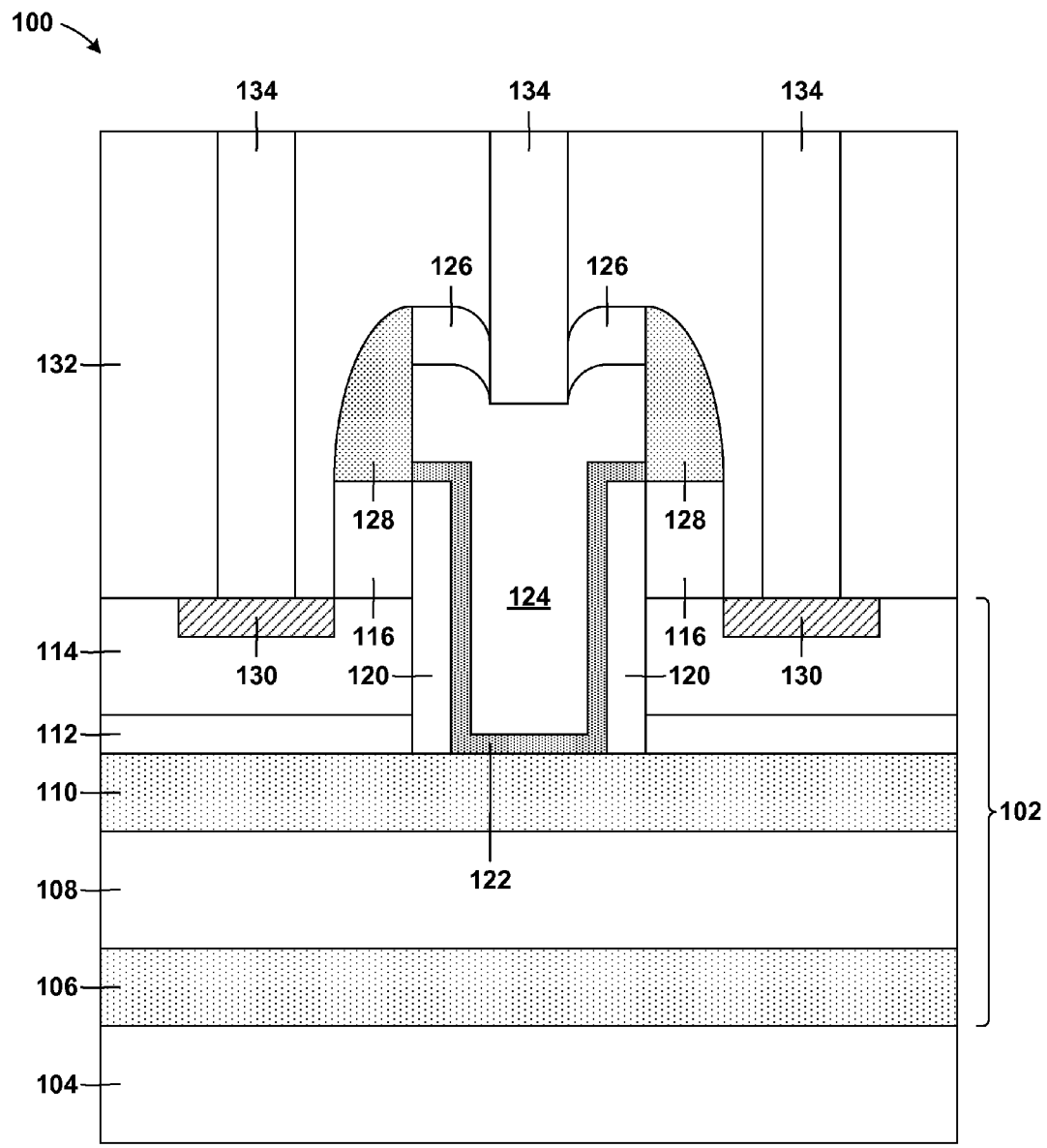
FIG. 10 is a cross-sectional view that illustrates a final structure according to another exemplary embodiment.

Referring now to FIG. 10, the structure 100 is illustrated according to an alternative embodiment. In the present embodiment, a portion of the barrier layer 110 may not be optionally removed, as described above with reference to FIG. 4 above. As such the gate dielectric 122 at the bottom of the gate trench 118 (FIG. 3) may be formed above the barrier layer 110. When the gate dielectric 122 is formed above the barrier layer 110, the barrier layer 110 may act as a gate dielectric as well. Since the barrier layer 110 is grown epitaxially on the channel 108, the interface-state density ($D_{it}$) at the channel to gate dielectric interface is reduced, which leads to improved sub-threshold device performance and improved device reliability.

Figure 11:
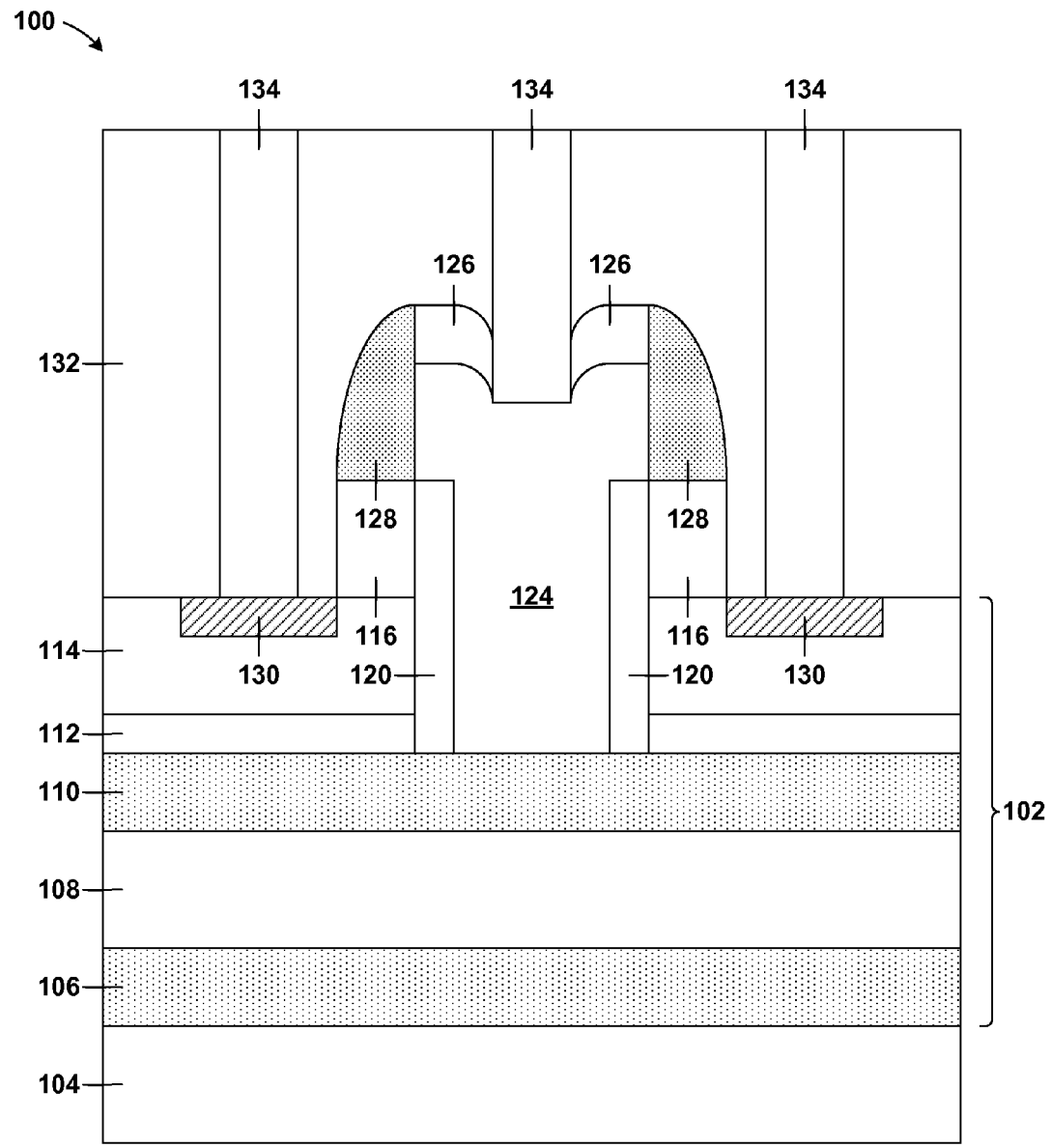
FIG. 11 is a cross-sectional view that illustrates a final structure according to another exemplary embodiment.

Referring now to FIG. 11, the structure 100 is illustrated according to an alternative embodiment. In the present embodiment, the final structure 100 may omit the gate dielectric 122 and include only a III-V semiconductor device having a T-gate structure and the self-aligned source-drain contacts 130, as described above. When the gate conductor 124 is formed directly on the barrier layer 110 by omitting the gate dielectric 122, the total gate capacitance is increased, which leads to higher device on-state current.

Figure 12:
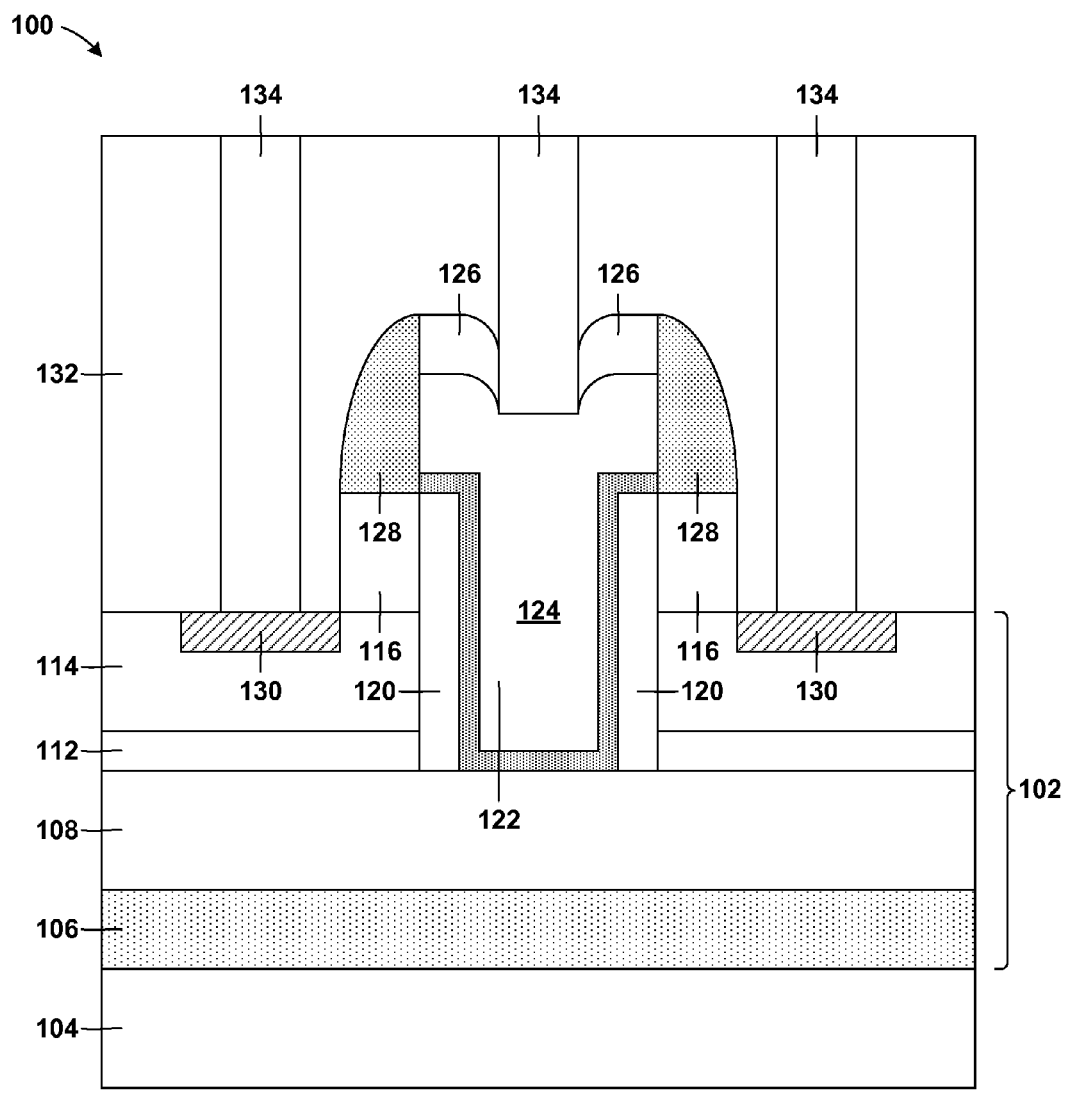
FIG. 12 is a cross-sectional view that illustrates a final structure according to another exemplary embodiment.

Referring now to FIG. 12, the structure 100 is illustrated according to an alternative embodiment. In the present embodiment, the final structure 100 may be fabricated without the barrier layer 110. As such the gate dielectric 122 at the bottom of the gate trench 118 (FIG. 3) may be formed above the channel layer 108. When the barrier layer 110, which acts like a gate dielectric when present underneath the gate conductor 124, is omitted, the total gate capacitance is increased, which leads to higher device on-state current.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
   forming a dielectric layer above a III-V compound semiconductor-containing heterostructure;
   forming a gate dielectric having a dielectric constant greater than 4.0 positioned within a gate trench, the gate trench formed within the dielectric layer and the III-V compound semiconductor-containing heterostructure;
   forming a gate conductor within the gate trench directly on top of the gate dielectric, the gate conductor extending above the dielectric layer;
   forming a pair of sidewall spacers directly on top of the dielectric layer and along opposite sides of a portion of the gate conductor extending above the dielectric layer,
   removing a portion of the dielectric layer to form a first outside edge of the dielectric layer aligned with a first outside edge of a first one of the sidewall spacers of the pair of sidewall spacers, and a second outside edge of the dielectric layer aligned with a second outside edge of a second one of the sidewall spacers of the pair of sidewall spacers, wherein a first inside edge of the first one of the sidewall spacers is aligned with a first inside edge of the dielectric layer, and a second inside edge of the second one of the sidewall spacers is aligned with a second inside edge of the dielectric layer; and
   forming a pair of source-drain contacts self-aligned to the pair of sidewall spacers.

2. The method of claim 1, wherein forming a III-V compound semiconductor-containing heterostructure comprises:
   forming a III-V compound semiconductor buffer layer on an upper surface of a substrate;
   forming a III-V compound semiconductor channel layer on an upper surface of the III-V compound semiconductor buffer layer;
   forming a III-V compound semiconductor barrier layer on an upper surface of the III-V compound semiconductor channel layer; and
   forming a III-V compound semiconductor contact layer on an upper surface of the III-V compound semiconductor barrier layer.

3. The method of claim 1, further comprises:
   doping a region of the III-V compound semiconductor-containing heterostructure with an element from Group IV, II, or VI of the Periodic Table of Elements.

4. The method of claim 1, further comprising:
   forming an inner spacer along a vertical sidewall of the gate trench before forming the gate dielectric.

5. The method of claim 1, wherein the dielectric layer comprises a dielectric material having positive etch selectivity from a dielectric material of the pair of sidewall spacers.

6. The method of claim 1, wherein forming the pair of source-drain contacts self-aligned to the pair of sidewall spacers comprises:
   depositing a blanket layer of metal on top of the pair of sidewall spacers and the III-V compound semiconductor-containing heterostructure;
   annealing the blanket layer of metal and the III-V compound semiconductor-containing heterostructure causing the blanket layer of metal to react with an upper layer of the III-V compound semiconductor-containing heterostructure, and form the pair of source-drain contacts self-aligned to the pair of sidewall spacers, wherein an edge of each individual source-drain contact is aligned with a respective one of the first and second outside edges of the pair of sidewall spacers; and
   removing an unreacted portion of the blanket layer of metal.

7. The method of claim 1, wherein a portion of the gate conductor above the III-V compound semiconductor heterostructure is wider than a portion of the gate conductor within the III-V compound semiconductor heterostructure.

8. The method of claim 1, wherein forming the gate trench comprises etching a portion of the dielectric layer.

* * * * *